United States Patent
Wang et al.

(10) Patent No.: US 7,270,761 B2
(45) Date of Patent: Sep. 18, 2007

(54) FLUORINE FREE INTEGRATED PROCESS FOR ETCHING ALUMINUM INCLUDING CHAMBER DRY CLEAN

(75) Inventors: Xikun Wang, Sunnyvale, CA (US); Hui Chen, San Jose, CA (US); Anbei Jiang, Sunnyvale, CA (US); Hong Shih, West Covina, CA (US); Steve S. Y. Mak, Pleasanton, CA (US)

(73) Assignee: Appleid Materials, Inc, Santa Clara, CA (US)

( * ) Notice: Subject to any disclaimer, the term of this patent is extended or adjusted under 35 U.S.C. 154(b) by 294 days.

(21) Appl. No.: 10/273,580

(22) Filed: Oct. 18, 2002

(65) Prior Publication Data

US 2004/0074869 A1   Apr. 22, 2004

(51) Int. Cl.
*H01L 21/302* (2006.01)

(52) U.S. Cl. ............................ 216/67; 216/41; 216/47; 216/49; 216/64; 216/67; 216/75; 216/77; 134/1.1; 134/1.2; 134/22.1; 134/905; 438/720; 438/725; 438/742; 438/905

(58) Field of Classification Search .................. 216/41, 216/47, 49, 64, 67, 75, 77; 134/1–1.2, 22.1, 134/30; 438/720, 725, 742, 905
See application file for complete search history.

(56) References Cited

U.S. PATENT DOCUMENTS

| 4,372,807 | A | | 2/1983 | Vossen, Jr. et al. ......... 156/643 |
|---|---|---|---|---|
| 4,511,429 | A | | 4/1985 | Mizutani et al. ............ 156/643 |
| 4,618,398 | A | * | 10/1986 | Nawata et al. .............. 438/720 |
| 5,320,707 | A | | 6/1994 | Kanekiyo et al. ........... 156/665 |
| 5,356,478 | A | * | 10/1994 | Chen et al. ..................... 134/1 |
| 5,468,686 | A | | 11/1995 | Kawamoto .................. 437/229 |
| 5,597,444 | A | * | 1/1997 | Gilton ........................ 438/710 |
| 5,779,926 | A | | 7/1998 | Ma et al. ...................... 216/67 |
| 5,827,437 | A | * | 10/1998 | Yang et al. .................... 216/77 |
| 5,994,235 | A | | 11/1999 | O'Donnell .................. 438/720 |
| 6,090,717 | A | | 7/2000 | Powell et al. ............... 438/710 |
| 6,136,723 | A | * | 10/2000 | Nagase ........................ 438/725 |
| 6,348,405 | B1 | * | 2/2002 | Ohuchi ....................... 438/636 |
| 6,683,002 | B1 | * | 1/2004 | Chooi et al. ................ 438/687 |
| 2002/0142486 | A1 | * | 10/2002 | Yanagawa et al. ............. 438/2 |

* cited by examiner

*Primary Examiner*—Anita Alanko
(74) *Attorney, Agent, or Firm*—Charles Guenzer (57) ABSTRACT

A fluorine-free integrated process for plasma etching aluminum lines in an integrated circuit structure including an overlying anti-reflection coating (ARC) and a dielectric layer underlying the aluminum, the process being preferably performed in a single plasma reactor. The ARC open uses either $BCl_3/Cl_2$ or $Cl_2$ and possibly a hydrocarbon passivating gas, preferably $C_2H_4$. The aluminum main etch preferably includes $BCl_3/Cl_2$ etch and $C_2H_4$ diluted with He. The dilution is particularly effective for small flow rates of $C_2H_4$. An over etch into the Ti/TiN barrier layer and part way into the underlying dielectric may use a chemistry similar to the main etch. A $Cl_2/O_2$ chamber cleaning may be performed, preferably with the wafer removed from the chamber and after every wafer cycle.

34 Claims, 3 Drawing Sheets

FLUORINE FREE INTEGRATED PROCESS FOR ETCHING ALUMINUM INCLUDING CHAMBER DRY CLEAN

FIELD OF THE INVENTION

The invention relates generally to etching of semiconductor integrated circuits. In particular, the invention relates to an integrated process of forming aluminum lines by plasma etching and including cleaning the process chamber.

BACKGROUND ART

Modern semiconductor integrated circuits, usually formed in silicon substrates or wafers, include not only the active semiconductor devices but also several metallization levels formed over the silicon substrate to provide the complex electrical connections required for integrated circuits incorporating tens or hundreds of millions of discrete semiconductor devices. Regularly arranged memory circuits can be designed with only three metallization levels, but advanced logic devices such as microprocessors may require five or more levels.

Each metallization level requires a dielectric layer of, for example, silicon dioxide separating two levels of horizontal lines of, for example, aluminum extending horizontally across the integrated circuit. Via holes are etched through the dielectric layer and filled with a conductor, most usually aluminum, to connect aluminum lines on different levels. The first metallization level has a dielectric layer formed directly over the silicon substrate, and contact holes filled with a conductor, which may be tungsten, connect the first-level aluminum lines with the active semiconductor devices.

Although there has been much recent interest in copper metallization and a dual-damascene metallization structure which does not require etching of copper, it is believed that the more conventional aluminum metallization lines formed by etching aluminum will continue to be effective even as feature sizes are reduced to 0.13 µm and below.

Figure 1:
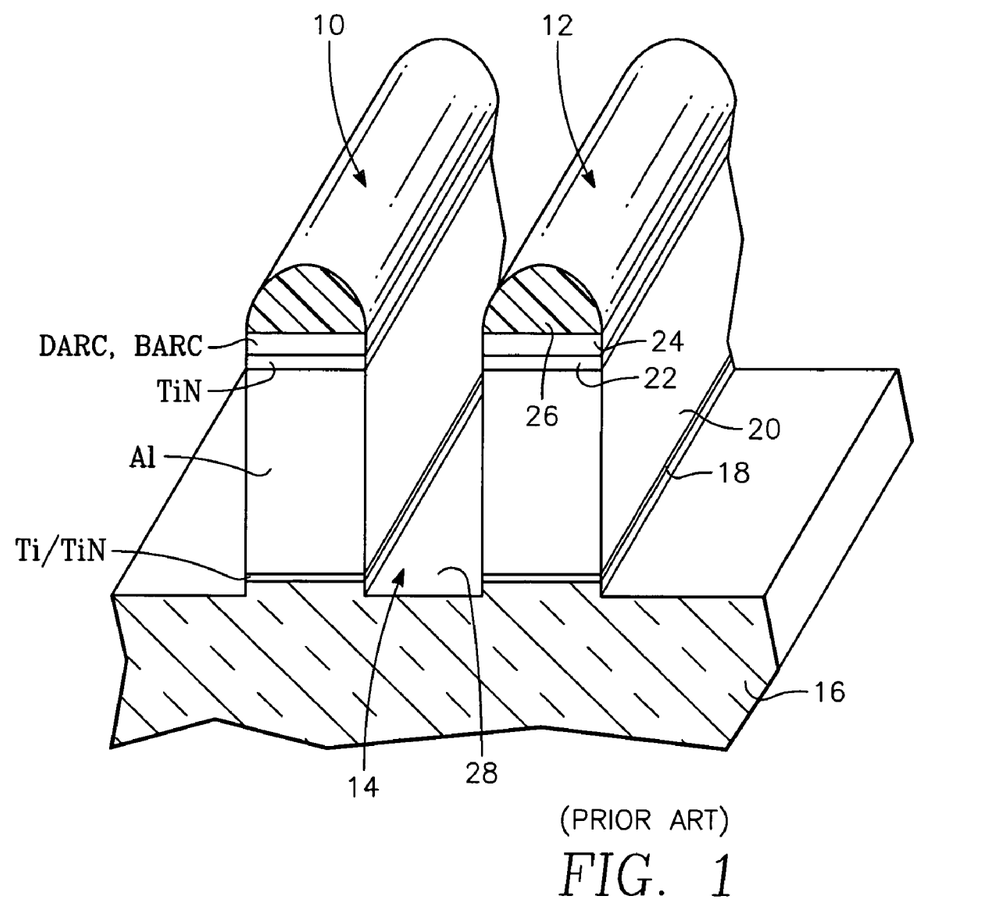
FIG. 1 is a sectioned orthographic view of one level of aluminum horizontal interconnects illustrating its method of forming.

The formation of a typical metallization structure is illustrated in the sectioned orthographic view of FIG. 1, which emphasizes the fact that the horizontally extending metallization lines are often aggregated into buses of multiple parallel lines 10, 12 having a minimum gap 14 between them. This figure does not include metallized vias penetrating an oxide layer. The lines 10, 12 may be formed with horizontal features sizes of 0.25 µm or less with a gap 14 between them of approximately the same size. For such small feature sizes, special care must be exercised because the small horizontal feature sizes are being reduced while the vertical dimensions are being maintained nearly constant at about 0.7 µm or somewhat above. A generally planar stack structure is first deposited on an underlying dielectric layer 16 separating this metallization level from the underlying metallization level or the silicon substrate. Unillustrated via holes may penetrate the dielectric layer 16 to contact conductive structure in the underlying layer to the aluminum lines 10, 12. Until recently, the dielectric layer 16 has typically been silica, of the approximate composition $SiO_2$, and other silicate glasses. However, there has been much recent interest in low-k dielectrics, that is, having a lower dielectric constant than silica. One example is fluorosilicate glass (FSG). Other low-k dielectrics include silicon-based oxides and carbon-based polymers.

The stack structure comprises from the bottom a thin barrier layer 18, typically of Ti/TiN, an aluminum layer 20, a lower anti-reflective coating (ARC) layer 22, typically of TiN, and an upper ARC layer 24, either of an organic ARC material or a inorganic one, such as silicon oxynitride (SiON). In a typical via process, the barrier layer 18 is conformally coated onto the sides of the via as well as to the top of the dielectric layer 16 and the aluminum layer 20 fills the remainder of the via and extends above the top of the via to provide aluminum for horizontal interconnects. The remaining layers 22, 24 are deposited over the planar top of the aluminum layer 20.

A SiON ARC layer is often referred to as dielectric ARC or DARC. An alternative upper ARC layer 24 is an organic ARC material, generically called BARC, which is a carbon-based polymer. The aluminum layer 20 is typically formed of an aluminum alloy of aluminum and less than 10 wt % of an alloying element, for example, 0.5 to 2% of copper. Silicon is another alloying element of less than 10% alloying fraction. In the barrier layer 18, the TiN is acting as the actual barrier. The somewhat optional Ti acts as a glue layer to the underlying oxide. Typical thicknesses for the layers are presented in TABLE 1.

TABLE 1

|  | Thickness (nm) |
| --- | --- |
| SiON ARC | 30-60 |
| Organic ARC | 60-150 |
| TiN ARC | 25-150 |
| Al-M1 | 300-500 |
| Al-M2 | 400-800 |
| TiN Barrier | 25-100 |
| Ti Glue | 10-50 |

The thickness of the aluminum typically increases from the lowest level M1 of metallization to increasingly thicker layers in the upper levels, such as the second metal level M2.

A photoresist layer 26 is deposited over the planar stack structure and photographically patterned into a photoresist mask. Thereafter, dry plasma etching is used to etch through the ARC layers 24, 22, the aluminum layer 20, and the Ti/TiN barrier layer 18 according to the pattern of the photomask. It is preferred that the etching extend partially into the oxide layer 16 in what is referred to as an over etch producing a recess 28 in the oxide layer 16. An exemplary depth of the oxide recess is 50 nm. The over etch avoids two problems which would otherwise tend to electrically short together the adjacent aluminum lines 10, 12. The Ti/TiN barrier 18 has a small but finite electrically conductivity, but the etching process has some window of processing parameters. To guarantee that the slightly conductive Ti/TiN barrier 18 is not continuous between the two lines 10, 12 but is interrupted by the gap 14, the recess 28 produced by the over etch assures that the Ti/TiN barrier 18 is removed in the gap 14. The recess 28 is also effective in isolating any conductive metallic residues that may form at the bottom of the gap 14 from contacting the partially conductive Ti/TiN barrier layers 18 of the two aluminum lines 10, 12.

Deep ultraviolet (DUV) radiation is used to pattern the photoresist 26 because of the small features being defined. The two ARC layers 22, 24 are needed to maintain the resolution of the patterning radiation. Furthermore, the thickness of the DUV photoresist 26 needs to be limited if the patterning radiation is to maintain focus through the photoresist thickness. The limited photoresist thickness imposes a strict requirement on the selectivity relative to photoresist of the etching of the other layers. That is, the entire etch process requires a high photoresist selectivity. Inevitably, a significant amount of the photoresist is etched. Photoresist involves complex photochemistry but for etching purposes it can be characterized as a carbon-based polymer, in particular, nearly a polyethylene composition of —$(CH_2)_n$—. The etched polymer is likely to coat the chamber walls. Although a polyethylene chamber coating is relatively dense and robust, if it builds up excessively, it will flake off creating a substantial particle problem. Accordingly, it is common practice to wet clean the chamber after a few hundred to a few thousand wafers, a process that requires operator time and reduces system uptime. An important metric for the commercial feasibility is the mean number of wafers between chamber clean (MWBC), a number which should be minimized. Chen et al. in U.S. Pat. No. 5,356,478 has suggested occasional but long chamber dry cleaning with a chlorine and oxygen plasma.

Plasma etching of aluminum is usually performed using chlorine gas ($Cl_2$) as the primary etching gas because of its high aluminum etching rate. Boron trichloride ($BCl_3$) is often used in combination with chlorine gas. Although not as fast at etching aluminum, it provides some passivation, which will be explained immediately below. A chlorine-containing etching gas reacts with aluminum to form aluminum trichloride ($AlCl_3$), which is volatile and is mostly exhausted from the etching chamber. A fluorocarbon such as $CF_4$ is sometimes added to the chlorine-based etching gas as a passivation gas to protect the photoresist and thus provide high photoresist selectivity and to coat the sidewalls and thus provide a good vertical profile in the aluminum. The benefits arise because the fluorocarbon under the proper conditions deposits a protective carbonaceous polymeric coating on the photoresist and on the aluminum sidewalls that is resistant to etching. However, fluorine radicals produced by the plasma interact with the aluminum being etched to form aluminum trifluoride ($AlF_3$), which is not only non-volatile but also forms a very hard material and which tends to deposit on the wafer and on the chamber walls. Even if aluminum is not being etched in a particular step, a substantial amount of $AlCl_3$ is nonetheless present in the chamber, often produced in a previous step and entrained in a polymeric residue built up on the chamber walls. Fluorine radicals created in a plasma of a fluorine-containing gas will react with $AlCl_3$ to produce $AlF_3$. The $AlF_3$ material may immediately form hard particles or it may deposit onto the chamber wall. Since carbonaceous polymer is also being coated on the chamber wall, the combination of the soft organic polymer and the hard inorganic metal fluoride does not bond together well and is not densified. The combination is unstable and readily flakes. In either case, the non-volatile $AlF_3$ or possibly small polymer particles are likely to fall on the wafer being etched. Even a single small particle falling on a small feature, such as the inter-line gap 14, is likely to cause the entire integrated circuit to fail.

To minimize the chamber flaking problem, it is typical to periodically clean the chamber wall. However, there is no known plasma chemistry which can etch $AlF_3$, most probably because the large difference in electronegativity of the two elements produces a very strong chemical bond. Instead, wet cleaning is typically used. Wet cleaning interrupts production, and wet cleaning $AlF_3$ is not completely effective anyway because $AlF_3$ is such a tough insoluble material. The wet cleaning cycle when $AlF_3$ is being produced may be as little as a few hundred wafers, clearly a commercially disadvantageous number for MWBC. The use of fluorocarbon etchants is also likely to produce aluminum fluoride when the chamber wall or other chamber parts are composed of anodized aluminum, that is, alumina, the preferred material because of its low cost and easy machinability. Alumina is readily etched by a fluorine plasma, which further introduces a problem with chamber lifetime.

Nitrogen gas or other nitrogen-containing compounds have also been suggested as passivating gases for achieving vertical profiles in aluminum etching. However, such a nitrogen passivating gas has been observed to deposit an ammonium salt on the chamber wall. Although such a salt is susceptible to etching by an oxygen and chlorine plasma, the cleaning rate is very slow.

Nawata has proposed in U.S. Pat. No. 5,618,398 that a substantial fraction of $CH_4$ be added to a $Cl_2/BCl_3$ gas plasma for etching aluminum and that $C_2H_4$ is one of several hydrocarbons that can substituted for $CH_4$.

The etching of the upper ARC layer 24 also presents problem because it has typically used a fluorine-containing gas. The typical etching recipe for DARC or SiON is combination of $Cl_2/BCl_3/Ar/CHF_3/CF_4$, often $Cl_2/CHF_3$ or $Cl_2/CF_4$ or $Cl_2/BCl_3$ with the addition of fluorine-containing gas. A fluorine-containing etching gas containing fluorocarbons and hydrofluorocarbons has the advantage in etching SiON, which is very similar to $SiO_2$, that it generates the protective polymer over the photoresist and other non-oxide materials and also deposits a polymer on the sidewall which promotes a vertical etch. Similarly, the recipe for BARC is typically $Cl_2/Ar/CHF_3/CF_4$. However, the presence of the fluorine-containing fluorocarbon, hydrofluorocarbon, or other fluorine-containing gas will again produce $AlF_3$ with the same deleterious results.

For all these reasons, it is desirable to provide an integrated process for plasma etching aluminum lines in which none of the critical steps of the process uses fluorine. It is also desirable that all the steps provide a high selectivity to photoresist and aluminum sidewall passivation while nonetheless achieving an acceptable etching rate of the material intended to be etched, especially the aluminum.

It is also desirable that the etching steps forming the integrated process be performed in a single plasma etch reactor.

It is further desirable that the process involves little or no wet cleaning of the chamber. If occasional wet cleaning is required, is should be infrequent so that the MWBC value should be large

SUMMARY OF THE INVENTION

The various aspects of the inventions allow a fluorine-free integrated process for etching aluminum lines in an integrated circuit. Typically, the aluminum line is overlaid by an anti-reflection coating, and a nitride barrier layer is interposed between the aluminum and the underlying dielectric. The fluorine-free process allows efficient plasma cleaning of the chamber.

In one aspect of the invention, the anti-reflection coating, which may be composed of silicon oxynitride or an organic material is etched with a chlorine-containing gas. The chlorine-containing gas may be a boron trichloride with the optional inclusion of a chlorine gas. The chlorine-containing gas may be supplemented with a passivating gas, for example, of a hydrocarbon such as ethylene.

The aluminum may be etched with a conventional gas mixture of boron trichloride and chlorine, but according to another aspect of the invention a passivating gas comprising hydrogen and carbon may be added to the gas mixture, preferably at chamber pressures below 40 milliTorr. The passivating gas is a hydrocarbon, such as —$(CH_2)_n$— gas, preferably ethylene, but other hydrocarbons such as dichloromethane and dichloroethane may be used.

The invention includes an fluorine-free aluminum etching process including a hydrocarbon passivating gas, followed by a $Cl_2/O_2$ plasma chamber clean. Preferably, the chamber clean is performed after each substrate etching cycle and with no wafer in the chamber. Preferably the passivating gas has a composition of $—(CH_2)_n—$, most preferably ethylene, which tends to form a polyethylene polymer.

DETAILED DESCRIPTION OF THE PREFERRED EMBODIMENTS

The invention allows a complete integrated process for performing the processing steps including the plasma etching required to achieve the structure of FIG. 1, and the integrated process does not use a fluorine-containing gas or with only a limited amount in a secondary step. As a result, it is possible to dry clean the chamber with a plasma and to dispense with frequent wet cleaning. The process includes the steps illustrated in the flow diagram of FIG. 2 after the deposition and patterning of the photomask 26. A breakthrough etch 30 assures that the two ARC layers 22, 24 have been etched through. Because the ARC structure may involve significantly different materials, it is often divided into substeps. Moderate anisotropy is desired, especially towards the end of the breakthrough etch 30. A main etch step 32 is designed to etch through the thick aluminum layer 20. High anisotropy and good selectivity to the underlying oxide are desired. An over etch step 34 not only assures uniform penetration of the aluminum layer but also removes the Ti/TiN layer 18 and forms the recess 28 in the oxide layer 16. In step 34, the wafer is dechucked from the electrostatic chuck. In step 36, the wafer is dechucked from the electrostatic chuck and in step 38 is removed from the chamber. In step 40, the chamber is cleaned by a dry etching process after the production wafer has been removed from the chamber. Although it is possible to clean the chamber only after processing multiple wafers, it is preferred that the chamber clean be performed after each wafer has been processed. None of these steps 30, 32, 34, 36, 38, and 40 needs to use a fluorine-containing gas. Each of these steps and their etching gas recipes will be described in more detail below.

Figure 2:
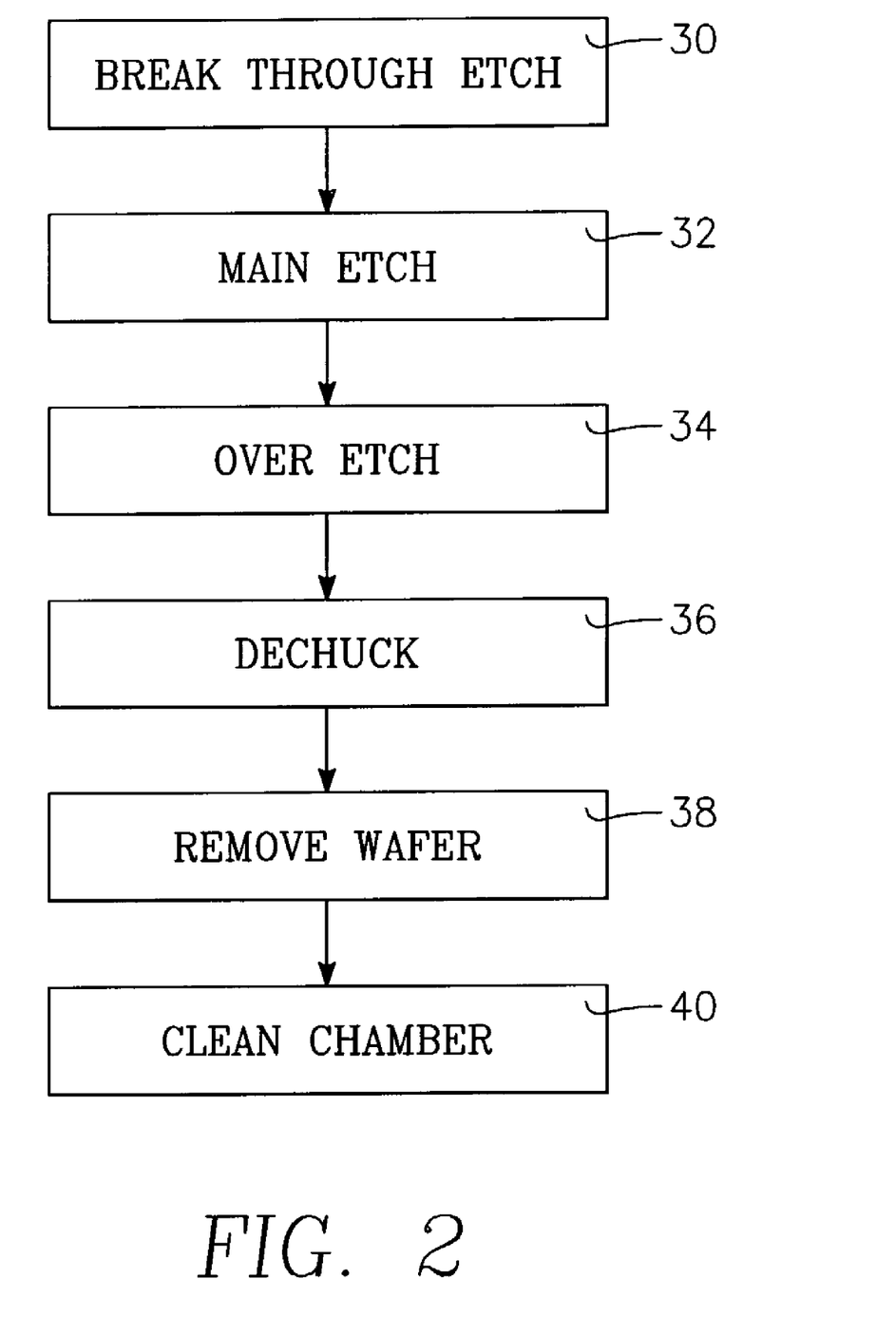
FIG. 2 is flow diagram of an integrated etch process for forming aluminum interconnects.
Figure 3:
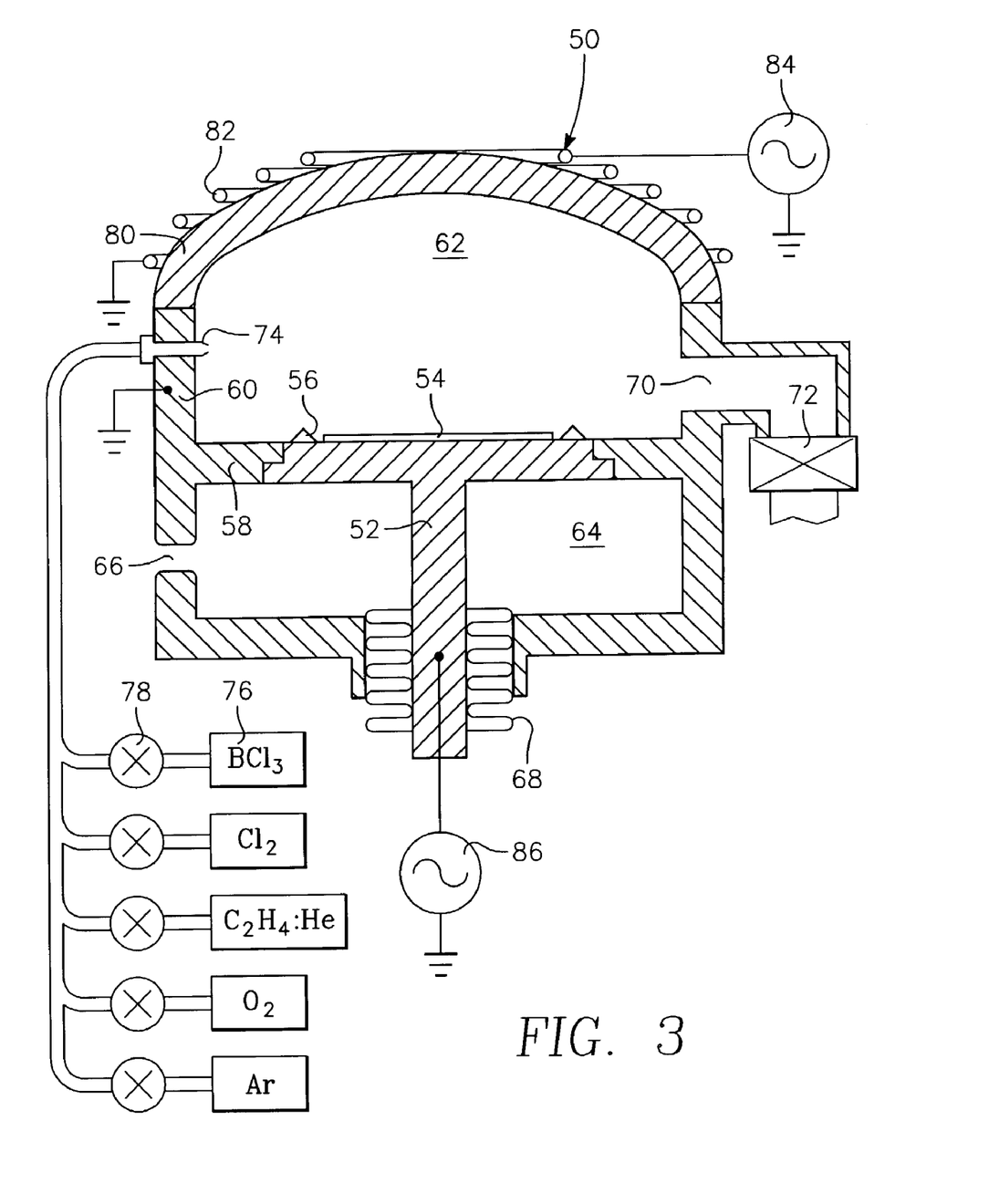
FIG. 3 is a schematic cross-sectional view of a plasma reactor in which the entire integrated etch process of FIG. 2 may be practiced.

All the etching steps 30, 32, and 34 can be performed in a single plasma etching chamber, such as the DPS Etch Reactor, available from Applied Materials, Inc. of Santa Clara, Calif. and illustrated schematically in the cross-sectional view of FIG. 3. The reactor 50 includes a vertically movable pedestal electrode 52 including an electrostatic chuck in its surface for holding a wafer 54 on its top surface. There are generally two types of electrostatic chucks, those having a polyimide chucking surface and those having a ceramic surface. A ceramic electrostatic chuck is preferred in the cases where the chamber is plasma dry cleaned without a wafer disposed on the chuck since polyimide is attacked by most reactive plasma. A plasma ring 56 also rests on the pedestal surface both to guide the etching gas and its plasma and to protect the outer periphery of the electrostatic chuck, which may be composed of polyimide. Unillustrated cooling water is flowed through the pedestal electrode 52 to maintain a controlled cathode temperature. Helium is flowed as a thermal transfer gas into a thin cavity in the surface of the pedestal electrode 52 underlying the wafer 54 to effectively transfer heat from the wafer 54 to the pedestal electrode 52 and its cooling water. Temperature can more rapidly be controlled by changing the helium pressure rather than changing the temperature of the chilled water.

The pedestal 52 is raisable to engage and seal, but be electrically isolated from, a dividing wall 58 of a grounded plasma reaction chamber 50 conveniently formed of anodized aluminum, although a material such as of boron carbide may be advantageously coated on the interior of the chamber. The dividing wall 58 separates an upper chamber 62, in which the plasma processing occurs, from a lower chamber 64. A sealable valve slit 66 formed in the lower chamber 64 allows a robot to move a paddle bearing the wafer through the slit 66 when the pedestal 52 is in the lower position to thereby transfer the wafer 54 between the exterior of the chamber and the pedestal 52. The chamber wall 60 is connected to the pedestal 52 through a flexible bellows 68 allowing the pedestal 52 to be moved vertically while maintaining the vacuum seal within the reaction chamber 50.

The upper chamber 62 is pumped through a pumping port 70 by a vacuum system 72 which maintains a predetermined pressure in the upper chamber 62 during wafer processing. The pumping system includes a turbo pump and a dry pump, both typically operated at maximum capacity, and a butterfly valve, the position of which is controlled in a feedback loop from a chamber pressure sensor to attain the programmed chamber pressure. Processing gas is supplied into the upper chamber 62 through multiple nozzles 74 arranged around the circumference of the upper chamber 62 above the pumping port 70. The nozzles 74 are connected to gas supplies 76 through respective mass flow controllers 78, which control the composition of the gas mixture. The chemical nature of those gases and their flow rates are subjects of this invention.

A dielectric dome 80 is sealed to the reaction chamber body 60 at the top of the upper chamber 62, and an RF inductive coil 72 wrapped around the dome 70 is powered by a controllable RF power supply 74 generating RF power at, for example, between 2 and 4 MHz to generate plasma in the plasma source region separated from the wafer 54, hence the name for the chamber of decoupled plasma source. Another controllable RF power supply 86 generating RF power at, for example, 13.56 MHz is connected to the pedestal electrode 52 through an unillustrated capacitive coupling circuit to electrically bias the electrode 52. An RF-biased, DC-isolated electrode in the presence of a plasma will become negatively DC biased. The controllable negative DC voltage on the pedestal electrode 52 is used to control the energy and directionality of positively charged plasma ions incident upon the wafer 54. The power supplied to the RF inductive coil 72 will be referred to as source power, and that supplied to the pedestal electrode 52 will be referred to as bias power.

An integrated aluminum etch process has been developed for 0.18 μm feature sizes in a structure summarized in TABLE 2 using ethylene as the passivating gas and an in situ chamber clean (ICC). The recipe for its steps is listed in TABLE 3.

TABLE 2

| Material | Thickness (nm) |
|---|---|
| Deep UV Photoresist | 600 |
| BARC | 60 |
| TiN | 40 |
| Al | 500 |
| TiN | 25 |
| Ti | 20 |

TABLE 3

| Parameter | Break Through 1 | Break Through 2 | Main Etch | Over Etch | Plasma Dechuck | Clean |
|---|---|---|---|---|---|---|
| $Cl_2$ (sccm) | 100 | 30 | 70 | 70 | | 70 |
| $BCl_3$ (sccm) | | 15 | 15 | 15 | | |
| $C_2H_4$:He (sccm) | | | 80 | 60 | 60 | |
| Ar (sccm) | | | | | 100 | |
| $O_2$ (sccm) | | | | | | 350 |
| Pressure (mTorr) | 6 | 8 | 12 | 14 | open | 15 |
| Source Power (W) | 1400 | 700 | 600 | 600 | 50 | 1200 |
| Bias Power (W) | 60 | 130 | 110 | 110 | 100 | 4 |
| Time (s) | 40 | 15 | 50 | 60 | 5 | 13 |

For all these steps, the cathode is held at 40° C.; and the walls and dome, at 80° C. The steps will be discussed sequentially.

The two breakthrough steps etch through the ARC layers including the overlying BARC and the underlying TiN. The first breakthrough step is optimized for the BARC. The second step completes the etch through the TiN layer and may etch part way into the aluminum. Both steps are free of fluorine although it is possible to use $CF_4$ as a passivating gas in the first breakthrough step since the underlying aluminum is never exposed to fluorine. However, unless aluminum chloride is cleaned from the chamber at the end of the previous cycle, the fluorine-containing passivating gas is still not recommended.

Silicon oxynitride (SiON), also referred to as DARC, may be used instead of BARC for the upper ARC layer. SiON is used for its optical properties so that its composition is usually specified in terms of its optical constants rather than its composition. However, a typical SiON composition usable as a deep-UV ARC layer is tabulated in TABLE 4.

TABLE 4

| Element | Atomic % |
|---|---|
| Si | 47 |
| O | 17 |
| N | 20 |
| H | 16 |

This composition produces optical constants in the deep UV of n=2.05 and k=0.55. If SiON or a similar inorganic oxide is used in place of the organic BARC, some fluorocarbon such as $CF_4$ or $CHF_3$ may need to be used in the first breakthrough step. However, as noted above, this fluorine-containing etching gas is used only in the initial part of the ARC etch and then only for a very short period so that the underlying aluminum is not directly exposed to the fluorine.

The chemistry for the second breakthrough step is similar to that for the main aluminum etch and contains a hydrocarbon passivating gas, preferably ethylene, which will be discussed in more detail immediately below with respect to the main aluminum etch.

The main etch uses a combination of a $BCl_3$ and $Cl_2$, which are chlorine-containing and non-carbon-containing gases, and the combination is effective at etching aluminum. It additionally uses a passivation gas including a hydrocarbon and a helium diluent. It is felt that many of the hydrocarbons are inappropriate for passivation gases which are needed to create a protective carbon-based polymer over the photoresist and on the walls of the vertical feature being etched in the aluminum and the lower portion of the ARC layer. It is believed that the best polymer contains a monomer of —$CH_2$—, that is, except for its ends, it is principally formed of (—$CH_2$—)$_n$, where n is a very large number. This polymer is referred to as polyethylene although highly branched polyethylene is common. The same ratio of hydrogen atoms to carbon atoms obtains for polypropylene, which has a side radical of methyl for every two carbons in the linear chain. While methane ($CH_4$) can supply the requisite number of hydrogens for the polymer, it additionally supplies two other hydrogens. The extra hydrogens are likely to be excited in the plasma and react with chlorine radicals performing the aluminum etching to form HCl, which is much less reactive with aluminum. As a result, the extra hydrogen decreases the aluminum etch rate. Thus the hydrocarbon gas preferably is composed of molecules of ($CH_2$)$_n$, where n is greater than 1. Ethylene ($C_2H_4$) is the simplest of this class and is widely and economically available because of its use in the plastics industry. Vossen et al. in U.S. Pat. No. 4,372,807 suggest cyclopropane ($C_3H_6$) and ethylene as passivation gases.

According to one aspect of the invention, the main etching gas mixture does not contains a fluorine-containing gas that is likely to react with the aluminum being etched to form $AlF_3$, either as particles or as a chamber coating. Of course, very minor fractions of a fluorine-containing gas may be intentionally or unintentionally introduced into the chamber in amounts that are not effective for the etching process of interest. Such amounts are not substantial if they do not contribute to the principal observed etching chemistry or produce aluminum fluoride particles of sufficient number requiring more frequent cleaning than would a fluorine-free polymeric coating. A maximum inconsequential flow rate of a fluorine-containing gas would be less than 1 sccm.

Ethylene has been observed to be greatly superior to fluorocarbons or nitrogen as a passivating gas. Relatively thin polyethylene coatings on the sidewall of the aluminum layer being etched provide acceptable profile control. Accordingly, the amount of ethylene needed for the process is very small, on the order of 1 or 2 sccm. Greater amounts will produce excessive sidewall polymerization on the sidewalls and even the bottom to produce excessive V-shaped tapering and even increase the likelihood of etch stop before the aluminum is etched through. However, conventional mass flow controllers have a flow resolution of little better than 1 sccm. Accordingly, a process recipe requiring 1 sccm of ethylene is very difficult to accurately implement with conventional gas equipment. In one aspect of the invention, ethylene gas is diluted within the supply bottle with helium or other chemically inactive gas. In particular, $C_2H_4$:He is commercially available which contains 2.7 vol % $C_2H_4$ and 97.3 vol % of He for a dilution factor of 37. Hence, the indicated flow rate of 60 sccm for $C_2H_4$:He, a flow rate that is easy to control, corresponds to a flow of 1.62 sccm of $C_2H_4$. This technique is particularly effective when the hydrocarbon flow rate is less than 5 sccm when dilution factors of 10 or greater are used. Alternatively stated, the total diluted flow is should be greater than 20 sccm. The use of diluted ethylene has been shown to produce a particularly wide process window, presumably because the flow of ethylene can be closely controlled with standard mass flow controllers. Diluted ethylene is commercially available for safety reasons because pure ethylene tends to be explosive. Although the plasma etching chemistry is not completely understood, it is possible that the helium contributes to reactive ion etching capable of achieving nearly vertical etching profiles.

Possible other hydrocarbon passivating gases for an aluminum etch process conforming to the chemical formula $(CH_2)_n$, n>1, include propylene ($C_3H_6$) and cyclopropane (c-$C_3H_6$) and such yet higher-order hydrocarbons. Furthermore, dichlorohydrocarbons such as dichloromethane ($CH_2Cl_2$) and dichloroethane ($C_2H_4Cl_2$) and others of the chemical formula $C_nH_{2n}Cl_2$, n>0 may be used as the passivating gas. The gases of both classes have the desired ratio of two between the numbers of the hydrogen and carbon components. The extra chlorine atoms in the dichlorohydrocarbons can participate in the chlorine-based aluminum etch. However, ethylene is more advantageous because of its commercial availability at high purity levels and relatively low cost arising from its widespread use in the plastics industry. Furthermore, the chlorine-free hydrocarbons are advantageous because the etching and passivating are controlled by separately metered gases.

The main etch may be terminated by a end point detector detecting optical emissions from $SiO_2$ being etched. However, in view of the long subsequent over etch, a timed etch seems sufficient.

Following the aluminum etch step, an over etch is performed to assure that the aluminum is etched through in all portions of the wafer, to etch through the Ti/TiN barrier layer, and to extend the etch into the underlying oxide. The over etch chemistry must also provide good selectivity to photoresist. A high aluminum etch rate and reasonable oxide etch rate are insufficient if the photoresist is also being quickly etched. Similarly, a low photoresist etch rate is insufficient if the metal etch rate is so low that the etch period must be extended. The over etch is advantageously performed using a recipe similar to that or the same of the main aluminum etch. In some alternative embodiments, there is somewhat more of the active chlorine gas. The continued supply of the polymerizing ethylene continues to passivate the aluminum sidewalls and to prevent undercutting in the oxide layer.

After the etching has been completed, the wafer is dechucked from the ceramic electrostatic chuck. Not only is the chucking voltage turned off, but a low-pressure argon plasma at minimum chamber pressure discharges any residual charge on the surface of the wafer. Some amount of wafer biasing during dechucking is sometimes required to support the plasma.

The previously described steps from the first part of the breakthrough etch through the plasma dechucking may be performed without extinguishing the plasma, only changing gas flows, chamber pressure, and power levels between the steps. After plasma dechucking, the plasma is extinguished, the pedestal is lowered, the slit valve to the etch reactor is opened, and the robot removes the wafer to either the wafer cassette or to a further processing station in the integrated processing tool.

For the chamber cleaning step, the slit valve is closed, the pedestal is raised to the sealed processing position, and a cleaning gas is filled into the chamber and excited into a plasma. If a dummy wafer can be placed on the pedestal for chamber clean, a polyimide electrostatic chuck can be used since it is protected from the cleaning plasma. However, a dummy wafer requires additional handling time, and introduces contamination issues. Alternatively, the production wafer can be left in the chamber on a polyimide chuck during the chamber clean. While this process has the advantage of the oxygen plasma cleaning and stripping the production wafer, the small amount of chlorine plasma introduces a possible source of aluminum corrosion for very small aluminum features. Therefore, advanced devices benefit from a waferless chamber clean and a ceramic electrostatic chuck that is resistant to the cleaning plasma. Although many benefits of the invention are still obtained if the chamber is cleaned only after a number of wafers have been processed, in situ cleaning after each wafer is advantageous in quickly removing any aluminum particles or coating before they can be fluorinated and for producing nearly constant chamber conditions between wafers.

The chamber clean may include a $O_2/Cl_2$ plasma with higher source power than in the main etch. In the fluorine free process described above, the chamber clean is directed primarily to removing polymerization rather than $AlF_3$ particles. Accordingly, the total flow of oxygen is substantially greater than that of chlorine by a factor of two or four or more. The oxygen plasma oxidizes the polymer to volatile CO, $CO_2$, $H_2$, and $H_2O$ and thus exposes any aluminum particles to the chlorine plasma. The chlorine clean is primarily directed to cleaning aluminum, titanium, and titanium nitride from the reactor walls to produce volatile $AlCl_3$ and $TiCl_4$. Although in the described recipe, the cleaning plasma simultaneously contains oxygen and chlorine, similar results can be obtained by an initial oxygen plasma for oxidizing the polymer and a subsequent chlorine-containing plasma for volatizing the aluminum previously entrained in the polymer into aluminum chloride. Particularly when the chamber cleaning is performed after every wafer, a stepped plasma clean of oxygen followed by chlorine is effective at removing most residue before they accumulate to a thickness at which they would flake off in sizable particulates.

The polyethylene coating on the walls is easily etched by the oxygen plasma, unlike an ammonium salt coating when $N_2$ is used as a passivating gas or aluminum fluoride when $CF_4$ or $CHF_3$ is used.

In the plasma clean, the bias power applied to the pedestal electrode may be very small, no more than 10% of the bias power applied in the aluminum etching phase because the chamber wall rather than the pedestal and associated electrostatic chuck is the main object of the cleaning. The small bias applied in the above cleaning recipe is effective at removing any small residue that has deposited on the pedestal electrode without unduly etching the electrostatic chuck. The DPS chamber allows the source power to be decoupled from the bias power, thus allowing effective chamber cleaning without undue etching of the delicate electrostatic chuck.

An alternative cleaning chemistry uses a plasma of $O_2$ and HCl (hydrogen chloride or hydrochloric acid). The oxygen and chlorine radicals in the plasma, as before, are effective at volatizing and removing carbon and metals respectively.

The hydrogen in the plasma tends to react with oxygen to produce a hydroxyl ion [OH]⁻, which is very effective at reacting with any salts cleaning them from the chamber. One such salt is the previously mentioned ammonium salt resulting from using nitrogen gas or other nitrogen-containing compound as the passivating gas. Nitrogen also is included in the most photoresist materials. An example of such an $O_2/HCl$ cleaning recipe is listed in TABLE 4, together with the final purge step.

TABLE 4

| Parameter | Clean | Purge |
|---|---|---|
| $O_2$ (sccm) | 260 | |
| HCl (sccm) | 140 | |
| Ar (sccm) | | 100 |
| Pressure (mTorr) | 30 | open |
| Source Power (W) | 1200 | |
| Bias Power (W) | 4 | |
| Time (s) | 13 | 2 |

A plasma of $CF_4$ or other fluorine-containing gas plasma has been suggested for chamber cleaning. Such a fluorine chemistry is not recommended when a waterless plasma clean is performed and the ceramic electrostatic chuck is composed of AlN. This material is a semiconductor and effective at forming an electrode of the electrostatic chuck. However, when it is exposed to a fluorine plasma, a surface of the AlN is converted to $AlF_3$, which is an electrical insulator and severely degrades the performance of the electrostatic chuck.

Because of the fluorine-free processing, cleaning needs to be performed only infrequently but should be performed more frequently than the several hundred wafers suggested by Chen et al. in U.S. Pat. No. 5,356,478 for a $O_2/Cl_2$ plasma cleaning of the chamber. Nonetheless, the total cleaning time is perhaps not significantly different. In an example of multi-wafer cycle, wafers are typically delivered to the system in cassettes carrying twenty-five wafers, one of which may be a dummy wafer, particularly if a polyimide electrostatic chuck is being used. Because of the reduced need for chamber cleaning in a fluorine-free process, all twenty-four production wafers may be subjected to the integrated etch process but without an intervening chamber clean. Then the dummy wafer is inserted into the metal etch chamber and a longer dry cleaning is performed to remove the thicker polymer. However, delaying the chamber clean even for twenty-four wafers introduces process variations arising from chamber conditions between the first and last production wafer and also increases the possibility of flaking towards the end of the cycle without substantially reducing the total cleaning time. Therefore, short waterless chamber cleaning after each cycle is preferred. Although, occasional wet chamber cleaning may still be required, it will be at much less frequent intervals than if a convention fluorine-containing etch gas mixture is used.

Furthermore, the overall time required for the cleaning process enabled by a fluorine-free integrated process can be considerably reduced since there is no need to remove the nearly insoluble aluminum fluoride.

The invention thus uses commercially available gases in proven processes to significantly reduce chamber cleaning and increase the mean number of wafers between chamber wet cleaning while still providing advanced etch performance.

The invention further benefits the stability of the process between wafers when the chamber is cleaned after every wafer cycle, thus eliminating chamber polymerization as a wafer-to-wafer variability.

The invention claimed is:

1. An integrated process for etching aluminum formed in a structure on a substrate of an aluminum layer overlying a dielectric layer and overlaid by an anti-reflection coating, comprising the steps performed in a single plasma etch reactor of:
   a first step of plasma etching at least a final portion of said anti-reflection coating with a first plasma of a first gas mixture comprising a first chlorine-containing and non-carbon-containing etching gas comprising $Cl_2$ and $BCl_3$ and a first passivating gas chosen from the group consisting of hydrocarbon-containing gases and dichlorohydrocarbon-containing gases but not including an effective amount of fluorine, wherein flows of the first etching gas and the first passivating gas pass through separate flow controllers to control a first composition of the first etching gas supplied into the plasma etch reactor and wherein the aluminum layer is exposed to the first plasma during the first step;
   a second step of plasma etching said aluminum layer with a second plasma of a second gas mixture comprising a second chlorine-containing etching gas and a second passivating gas selected from the group consisting of hydrocarbon-containing gases and dichlorohydrocarbon-containing gases but not including an effective amount of fluorine, wherein flows of second etching gas and the second composition of the second gas mixture supplied into the plasma etch reactor; and
   a cleaning step performed after said substrate has been removed from said reactor of exposing an interior of said reactor to a plasma of a third chlorine-containing gas and oxygen gas.

2. The process of claim 1, wherein said chlorine-containing gas comprises chlorine gas.

3. The process of claim 1, wherein said chlorine-containing gas comprises hydrogen chloride.

4. The process of claim 1, wherein said cleaning step is performed for each cycle of said first and second steps of plasma etching.

5. The process of claim 1, wherein said each of said first and second passivating gases comprises a respective $(CH_2)_n$, wherein n is an integer greater than 1.

6. The process of claim 5, wherein both of said first and second hydrocarbon-containing gases comprise ethylene.

7. The process of claim 6, wherein both of said first and second etching gases comprises $Cl_2$ and $BCl_3$.

8. The process of claim 1, wherein at least one of said passivating gases comprises $C_nH_{2n}Cl_2$, wherein n is an integer greater than 0.

9. The process of claim 1, wherein both of said first and second etching gases comprise $Cl_2$ and $BCl_3$.

10. The process of claim 1, wherein said anti-reflection coating comprises silicon oxynitride.

11. The process of claim 1, wherein said anti-reflection coating comprises an organic material.

12. A process for etching aluminum performed in a plasma etch reactor, comprising the step of:
   etching said aluminum layer with a etching gas mixture supplied from at least one first source of a chlorine-containing and non-carbon-containing gas comprising $Cl_2$ and $BCl_3$ and a second source of $(CH_2)_n$ (n>1) and a chemically inactive gas, wherein said etching gas mixture does not include a substantial amount of fluorine and wherein said $(CH_2)_n$ is diluted in said second source by said inactive gas by a factor of at least 10 and is supplied to said etch reactor at a rate of no more than 5 sccm.

13. The process of claim 12, wherein said $(CH_2)_n$ comprises ethylene.

14. The process of claim 12, wherein said inactive gas comprises helium.

15. The process of claim 12, wherein said at least one first source comprises a source of $BCl_3$ and a source of $Cl_2$.

16. The process of claim 12, further comprising, subsequent to each of said etching steps, cleaning said chamber after said substrate has been removed from said reactor with an oxygen gas plasma and a chlorine-containing gas plasma.

17. An integrated process for etching aluminum formed in a structure of an aluminum layer overlying a dielectric layer and overlaid by an anti-reflection coating, comprising the steps performed in a single plasma etch reactor of:
    a first plasma etching step of plasma etching at least a final portion of said anti-reflection coating with a first plasma of a first gas mixture comprising a chlorine-containing and non-carbon-containing etching gas comprising $Cl_2$ and $BCl_3$ and a passivating gas selected from the group of hydrocarbon gases and dichlorohydrocarbon gases but not including an effective amount of fluorine, wherein said aluminum layer is exposed to the first plasma during the first plasma etching step; and
    a second plasma etching step of plasma etching said aluminum layer with a second plasma of a second gas mixture comprising said etching gas and said passivating gas but not including an effective amount of fluorine.

18. The process of claim 17, wherein said passivating gas comprises $(CH_2)_n$, wherein n>1.

19. The process of claim 18, wherein said passivating gas comprises ethylene.

20. The process of claim 17, further comprising cleaning said etch reactor after each cycle of said two plasma etching steps with a plasma of a chlorine-containing and oxygen-containing plasma.

21. An integrated process for etching aluminum formed in a structure of an aluminum layer overlying a dielectric layer and overlaid by an anti-reflection coating, comprising the steps performed in a single plasma etch reactor of:
    a first plasma etching step of plasma etching at least of final portion of said anti-reflection coating with a first plasma of a first gas mixture comprising a first chlorine-containing gas but not including an effective amount of fluorine, wherein the aluminum layer is exposed to the first plasma during the first plasma etching step;
    plasma etching said aluminum layer with a second plasma of a second gas mixture comprising a second chlorine-containing gas and a passivating gas comprising a gas consisting of hydrogen and carbon and helium gas, said second gas mixture not including an effective amount of fluorine; and
    plasma cleaning said chamber with a third plasma of a third gas mixture comprising oxygen gas and a third chlorine-containing gas chosen from the group consisting of chlorine gas and hydrogen chloride but not including an effective amount of fluorine, wherein a fraction of said chlorine gas in said third gas mixture is more than 25%.

22. The process of claim 21, wherein said fraction is between 30 and 50%.

23. The process of claim 22, wherein said third chlorine-containing gas comprises chlorine gas.

24. The process of claim 23, wherein said third gas mixture consists essentially of said oxygen gas and said chlorine gas.

25. The process of claim 21, wherein both of said first and second chlorine-containing gases comprise boron trichloride and chlorine gas.

26. The process of claim 25, wherein said passivating gas comprises ethylene.

27. The process of claim 21, wherein said first passivating gas comprises ethylene.

28. The process of claim 21, wherein said two plasma etching steps and said plasma cleaning steps are performed for each cycle of a plurality of cycles of said integrated process.

29. The process of claim 1, wherein each of the passivating gases contain a predetermined fraction of helium prior to metering of the passivating gases.

30. The process of claim 12, wherein the etching step includes commonly metering the $(CH_2)_n$ (n>1) and the chemically inactive gas.

31. The process of claim 17, wherein the passivating gas additionally comprises helium.

32. The process of claim 17, wherein the passivating gas comprises the dichlorohydrocarbon gas.

33. A method of etching aluminum in a plasma etch reactor, comprising:
    a first etching step of etching an aluminum layer in a substrate disposed in the plasma etch reactor with a plasma of a gas mixture comprising a chlorine-containing gas, a passivating gas having a composition of $(CH_2)_n$, where n>1, and helium and not including an effective amount of fluorine;
    a preceding second etching step of etching at least a final portion of an anti-reflection coating overlying the aluminum layer with a plasma of a second gas mixture comprising a second chlorine-containing etching gas and the passivating gas; and
    a succeeding cleaning step performed after the substrate has been removed from the reactor of exposing an interior of the reactor to a plasma of a third chlorine-containing gas and oxygen gas, wherein the cleaning step is performed after each of a plurality of cycles of the first etching step performed on respective ones of a plurality of the substrates.

34. The process of claim 12, further comprising a cleaning step performed after said substrate from said reactor of exposing an interior of said reactor to a plasma of a second chlorine-containing gas and oxygen gas.

* * * * *